(12) United States Patent
Kim et al.

(10) Patent No.: US 7,189,990 B2
(45) Date of Patent: Mar. 13, 2007

(54) ELECTRO LUMINESCENCE DISPLAY DEVICE

(75) Inventors: Woo Chan Kim, Gyeongsangbuk-do (KR); Jae Young Yang, Gyeongsangbuk-do (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/968,186

(22) Filed: Oct. 20, 2004

(65) Prior Publication Data
US 2005/0116221 A1 Jun. 2, 2005

(30) Foreign Application Priority Data
Oct. 21, 2003 (KR) .................. 10-2003-0073310

(51) Int. Cl.
*H01L 29/08* (2006.01)
(52) U.S. Cl. .................. 257/40; 257/98; 257/99
(58) Field of Classification Search .......... 257/40, 257/99, 100, 98
See application file for complete search history.

(56) References Cited

U.S. PATENT DOCUMENTS

| | | | |
|---|---|---|---|
| 3,997,892 A | 12/1976 | Susset | |
| 5,530,269 A * | 6/1996 | Tang | ............ 257/88 |
| 6,225,931 B1 | 5/2001 | Rao et al. | |
| 6,268,071 B1 * | 7/2001 | Yasukawa et al. | .......... 428/690 |
| 6,383,664 B2 * | 5/2002 | Bernius et al. | ............ 428/690 |
| 6,537,688 B2 * | 3/2003 | Silvernail et al. | ........... 428/690 |
| 6,982,470 B2 * | 1/2006 | Omori | .................. 257/434 |
| 2002/0018911 A1 | 2/2002 | Bernius et al. | |
| 2002/0060525 A1 | 5/2002 | Sagano et al. | |
| 2003/0042852 A1 | 3/2003 | Chen | |
| 2003/0062518 A1 | 4/2003 | Auch et al. | |

FOREIGN PATENT DOCUMENTS

| | | |
|---|---|---|
| EP | 0 884 930 A1 | 12/1998 |
| JP | 2000-150145 A | 5/2000 |
| JP | 2001-126868 A | 5/2001 |
| KR | 1020040018914 A | 3/2004 |

* cited by examiner

*Primary Examiner*—Sara Crane
(74) *Attorney, Agent, or Firm*—Birch, Stewart, Kolasch & Birch, LLP

(57) ABSTRACT

An electro luminescence display device is adapted for preventing the deterioration of an organic light-emitting layer by ultraviolet rays during a sealing process, and a transparent substrate; an organic light-emitting layer formed on the transparent substrate; a packaging plate bonded with the transparent substrate by a sealant to cover the organic light-emitting layer; and a light-intercepting member to prevent ultraviolet rays illuminated onto the sealant during bonding the transparent substrate with the packaging plate from being reflected by the packaging plate onto the organic light-emitting layer.

10 Claims, 10 Drawing Sheets

ELECTRO LUMINESCENCE DISPLAY DEVICE

This application claims the benefit of Korean Patent Application No. P2003-73310 filed in Korea on Oct. 21, 2003, which is hereby incorporated by reference.

BACKGROUND OF THE INVENTION

1. Field of the Invention

The present invention relates to an electro luminescence display device, and more particularly to an electro luminescence display device that is adaptive for preventing the deterioration of an organic light-emitting layer by ultraviolet ray in a sealing process.

2. Description of the Related Art

Recently, there have been highlighted various flat panel display devices that are capable of reducing their weight and bulk which are disadvantages of a cathode ray tube (CRT). Such flat panel display devices include a liquid crystal display (LCD), a field emission display (FED), a plasma display panel (PDP) and an electro-luminescence (EL) display, etc.

The EL display in such display devices is a self-luminous device that makes a phosphorous material to emit light by a re-combination of electrons and holes. The EL display device is generally classified into an inorganic EL device using an inorganic compound as the phosphorous material and an organic EL using an organic compound as the phosphorus material. Such an EL display device has many advantages of a low voltage driving, a self-luminescence, a thin-thickness, a wide viewing angle, a fast response speed, a high contrast and so on such that it has been highlighted as a post-generation display device.

The organic EL device is comprised of an electron injection layer, an electron transport layer, a light-emitting layer, a hole transport layer and a hole injection layer. In such an organic EL device, when a predetermined voltage is applied between an anode and a cathode, electrons generated from the cathode move to the light-emitting layer through the electron injection layer and the electron transport layer, while holes generated from the anode move to the light-emitting layer through the hole injection layer and the hole transport layer. Accordingly, the electrons and the holes fed from the electron transport layer and the hole transport layer are re-combined to emit light.

Referring to FIG. 1, an EL display device of prior art includes a transparent substrate 2, an organic light-emitting layer 18 formed on the transparent substrate 2, a packaging plate 24 to seal off the organic light-emitting layer 18 on the transparent substrate 2, and a sealant 22 to bond the packaging plate 24 with the transparent substrate 2.

The organic light-emitting layer 18 includes an electron injection layer, an electron transport layer, alight-emitting layer, a hole transport layer and a hole injection layer that are deposited between an anode and a cathode (not shown). In the organic light-emitting layer 18, if voltage is applied between a transparent electrode as the anode and a metal electrode as the cathode, the electrons generated from the cathode move to the light-emitting layer through the electron injection layer and the electron transport layer, and the holes generated from the anode move to the light emitting layer through the hole injection layer and the hole transport layer. Accordingly, in the light-emitting layer, the electrons and the holes supplied from the electron transport layer and the hole transport layer collide with each other to be recombined, thereby generating light. The light is emitted to the outside through the anode, the transparent electrode, to display a picture.

The packaging plate 24 absorbs moisture and oxygen in the air, so a hygroscopic film 27 is stuck to the packaging plate 24 in order to protect the organic light-emitting layer 18 from the moisture and oxygen in the air. For this, the packaging plate 24 includes a stepped part 30 having an incline plane 26 and a horizontal plane. The stepped part 30 provides an inner space, where the hygroscopic film 27 is stuck, in the central part of the packaging plate 24.

The sealant 22 is spread between the transparent substrate 2 and the most outer stepped plane 28 of the packaging plate 24, and then it is hardened by illuminating it with ultraviolet rays, thereby bonding the packaging plate 24 with the transparent substrate 2. The packaging plate 24 seals up the organic light-emitting layer 18 by being bonded with the transparent substrate 2 by the sealant 22 in a vacuum state.

The electro luminescence display device of the related art, as shown in FIG. 2, bonds the transparent substrate 2 with the packaging plate 24 by a bonding device.

More specifically, the bonding device includes a large transparent substrate 2 where a plurality of organic light-emitting layers 18 are formed and which is fixed by a fixing means (not shown); a plurality of absorbers 50 to which a plurality of packaging plates 24 are absorbed, wherein the packaging plates 24 are bonded with the transparent substrate 2; a sealant 22 spread at the edge of the transparent substrate 2 or the packaging plate 24; an UV illuminating device 60 to illuminate an ultraviolet ray 62 to the sealant 24; and a mask 64 to mask other area than the sealant 24 in order that the ultraviolet ray 62 is not illuminated onto each organic light-emitting layer 18.

The absorbers 50 absorb the packaging plate 24 supplied from the outside, using a pad 52.

The absorber 50 has the packaging plate 24 absorbed on a pad 52 thereof and has the transparent substrate fixed thereto by a fixing means to align the organic light-emitting layer 18 formed on the transparent substrate 2 and the packaging plate 24.

And then, the ultraviolet ray 62 from the UV illuminating device 60 is illuminated onto the sealant 22 spread between the transparent substrate 2 and the packaging plate 24 for a designated time. At this moment, the mask 64 allows the ultraviolet rays 62 illuminated from the UV illuminating device 60 to be illuminated only on the sealant 22 spread between the transparent substrate 2 and the packaging plate 24, and the ultraviolet ray 62 is intercepted at the remaining areas.

Accordingly, the sealant 22 is hardened by the ultraviolet ray 62 illuminated through the mask 64 to bond the transparent substrate 2 with the packaging plate 24.

During the bonding of the transparent substrate 2 with the packaging plate 24 the ultraviolet rays 64 are illuminated onto the sealant 22 through the mask 64, as shown in FIG. 3. However, some ultraviolet rays 64 are reflected by the incline plane 26 of the stepped plane 30 formed at the packaging plate 24 to generate a reflected light 70. That is, the ultraviolet ray 64 is illuminated onto the sealant 22 to harden the sealant 22, and at the same time, is dispersed by the incline plane 26 of the stepped part 30 formed at the packaging plate 24 to generate the reflected light 70. The reflected light 70 may even be reflected over and over between the transparent substrate 2 and the incline plane 26 and the stepped plane 28 of the stepped part 30 of the packaging plate 24. This reflected ultraviolet light can illuminate onto the surrounding area of the organic light-emitting layer 18 of the EL display device. This reflected light 70 illuminated on to the organic light-emitting layer 18 deteriorates the organic light-emitting layer 18, and in addition, is illuminated onto the surrounding areas of the EL display device to change the characteristics of the driving devices, such as the transistor of the surrounding circuit of the EL display device.

Accordingly, the EL display device of related art has the edge of the organic light-emitting layer 18 deteriorated by the reflected light 70 which is caused by the reflection/dispersion of ultraviolet rays 64 illuminated onto the sealant 22 during the bonding process of the transparent substrate 2 and the packaging plate 24. Further, the reflected lights can change the characteristics of the driving devices of the surrounding circuit, thereby causing a brightness difference between the central part 80 of the EL display device and the other areas 82, as shown in FIG. 4.

SUMMARY OF THE INVENTION

Accordingly, it is an object of the present invention to provide an electro luminescence display device that is adapted for preventing the deterioration of an organic light-emitting layer by ultraviolet ray in a sealing process.

In order to achieve these and other objects of the invention, an electro luminescence display device according to an aspect of the present invention includes a transparent substrate; an organic light-emitting layer formed on the transparent substrate; a packaging plate bonded with the transparent substrate by a sealant to cover the organic light-emitting layer; and a light-intercepting member to prevent the ultraviolet rays, illuminated onto the sealant during bonding of the transparent substrate with the packaging plate, from being reflected by the packaging plate to illuminate the organic light-emitting layer.

The light-intercepting member is a light-intercepting projected part which is projected toward the transparent substrate from the packaging plate.

The light-intercepting projected part is located between the sealant and the organic light-emitting layer.

The light-intercepting projected part is projected from the packaging plate to be as close as possible to the organic light-emitting layer.

The light-intercepting projected part is formed to have a section of any one shape between a quadrangle and a triangle.

The light-intercepting member is a plurality of light-intercepting projected parts that are projected toward the packaging plate from the transparent substrate.

The light-intercepting projected parts are formed between the organic light-emitting layer and the end of the transparent substrate.

Each of the light-intercepting projected parts is formed to have a section of any one shape between a quadrangle and a triangle.

The light-intercepting member is an ultraviolet absorbing layer that is formed on the packaging plate to be opposite the transparent substrate and absorbs the ultraviolet rays.

The ultraviolet absorbing layer is formed at the edge of the packaging plate so as to be opposite between the end of the transparent substrate and the edge of the organic light-emitting layer, and in addition, to overlap the edge of the organic light-emitting layer.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Reference will now be made in detail to the preferred embodiments of the present invention, examples of which are illustrated in the accompanying drawings.

Hereinafter, the preferred embodiments of the present invention will be described in detail with reference to FIGS. 5 to 10.

Figure 1:
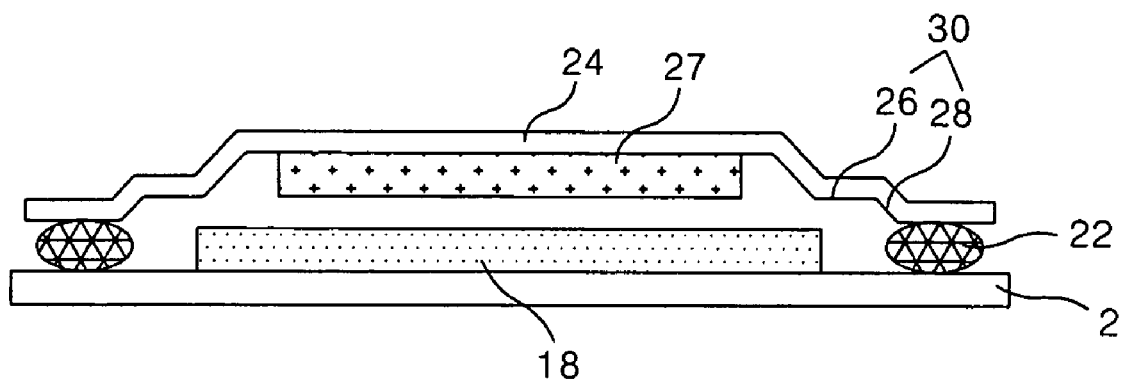
FIG. 1 is a sectional diagram representing a general electro luminescence display device.
Figure 2:
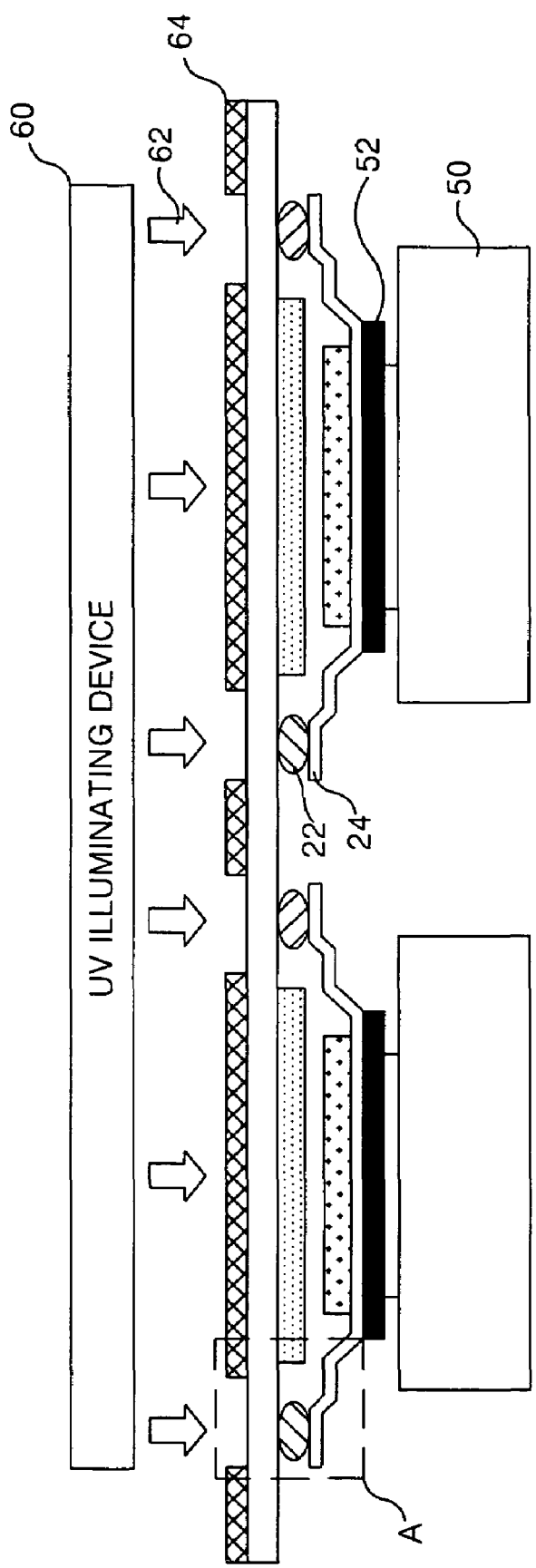
FIG. 2 is a sectional diagram representing a bonding process to bond a transparent substrate with a packaging plate, wherein the transparent substrate and the packaging plate are shown in FIG. 1.
Figure 3:
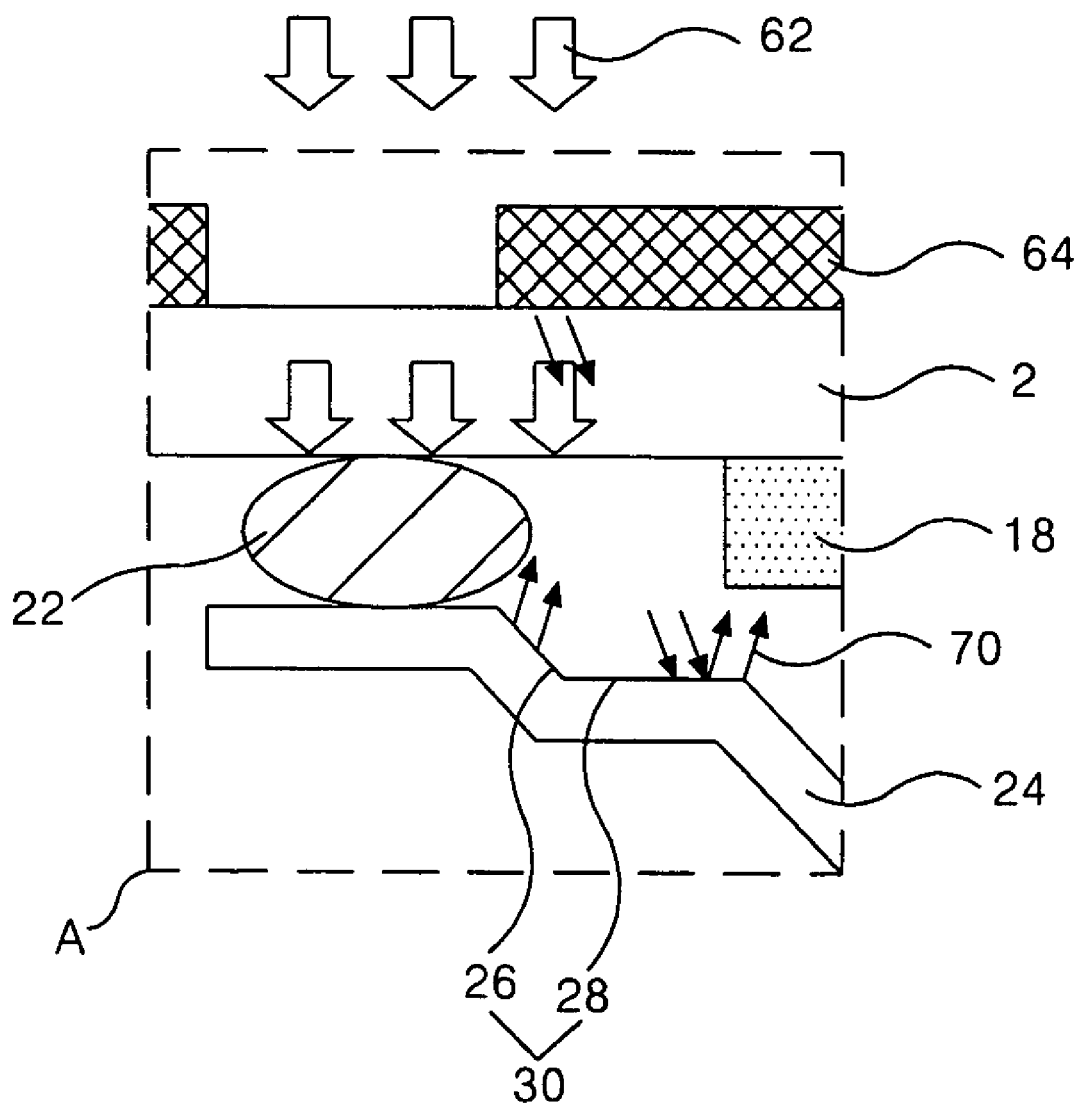
FIG. 3 is a sectional diagram of enlarged part A shown in FIG. 2.
Figure 4:
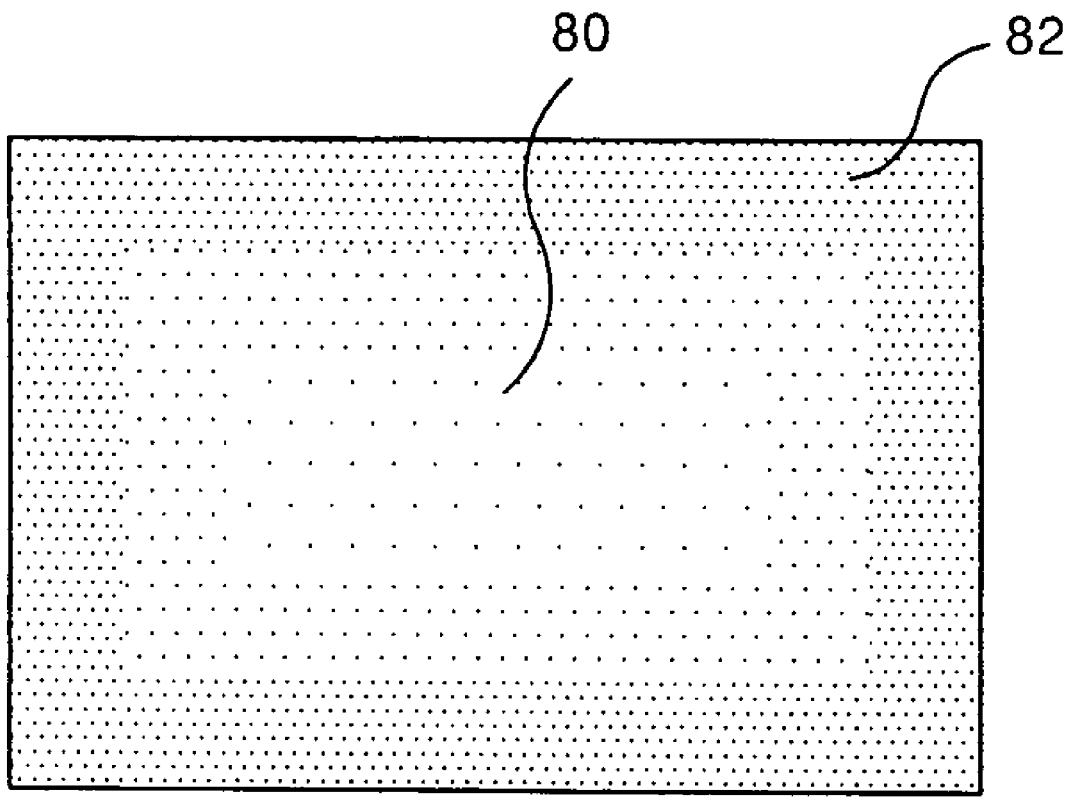
FIG. 4 is a view representing a brightness difference due to the deterioration of an organic light-emitting layer caused by an ultraviolet ray reflected by a packaging plate.
Figure 5:
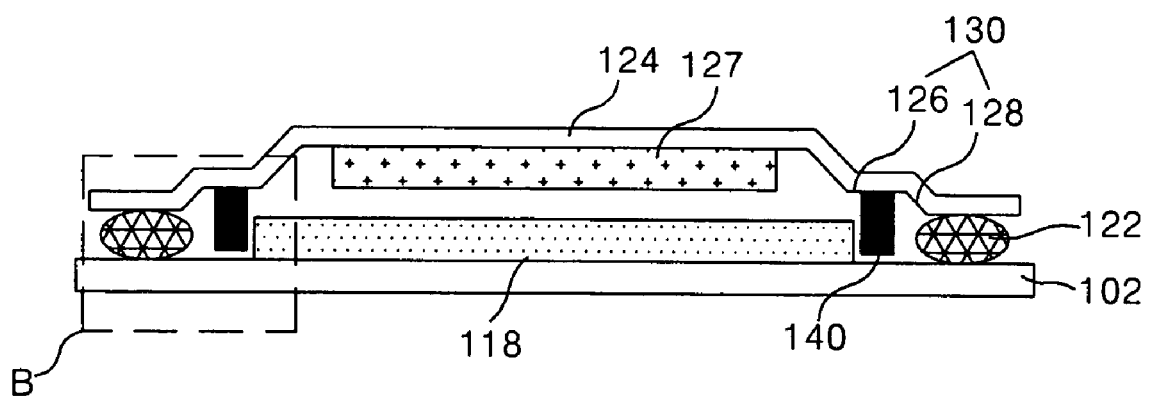
FIG. 5 is a sectional diagram representing an electro luminescence display device according to a first embodiment of the present invention.

Referring to FIG. 5, an electro luminescence display device according to a first embodiment of the present invention includes a transparent substrate 102; an organic light-emitting layer 118 formed on the transparent substrate 102; a packaging plate 124 to seal off the organic light-emitting layer 118 on the transparent substrate 102; a sealant 122 to bond the packaging plate 124 with the transparent substrate 102; and at least one light-intercepting projected part 140 formed at the packaging plate 124 to prevent an ultraviolet ray, illuminated onto the sealant 122 upon bonding the packaging plate 124 with the transparent substrate 102, from reflecting onto the light-emitting layer 118.

The organic light-emitting layer 118 includes an electron injection layer, an electron transport layer, a light-emitting layer, a hole transport layer and a hole injection layer that are deposited between an anode and a cathode (not shown). In the organic light-emitting layer 118, if voltage is applied between a transparent electrode as the anode and a metal electrode as the cathode, the electrons generated from the cathode move to the light-emitting layer through the electron injection layer and the electron transport layer, and the holes generated from the anode move to the light emitting layer through the hole injection layer and the hole transport layer. Accordingly, in the light-emitting layer, the electrons and the holes supplied from the electron transport layer and the hole transport layer collide with each other to be recombined, thereby generating light. The light is emitted to the outside through the anode, the transparent electrode, to display a picture.

The packaging plate 124 is bonded with the transparent substrate 102 by the sealant 122 to cover the organic light-emitting layer 118. The packaging plate 124 absorbs moisture and oxygen in the air, so a hygroscopic film 127 is stuck to the packaging plate 124 in order to protect the organic light-emitting layer 118 from the moisture and oxygen in the air. For this, the packaging plate 124 includes a stepped part 130 having an incline plane 126 and a horizontal plane 128. The stepped part 130 provides an inner space, where the hygroscopic film 127 is stuck, in the central part of the packaging plate 124.

The sealant 122 is spread between the transparent substrate 102 and the most outer stepped plane 128 of the packaging plate 124, and then it is hardened by illuminating it with ultraviolet rays, thereby bonding the packaging plate 124 with the transparent substrate 102. The packaging plate 124 seals up the organic light-emitting layer 118 by being bonded with the transparent substrate 102 by the sealant 122 in a vacuum state.

The at least one light-intercepting projected part 140 is projected toward the transparent substrate 102 and has a section of any one shape of a quadrangle and a triangle. The at least one light-intercepting projected part 140 exists between the sealant 122 and the organic light-emitting layer 118. The light-intercepting projected part 140 is projected to be as close to the organic light-emitting layer 118 as possible, and in addition, to have a designated gap with the transparent substrate 102.

The light-intercepting projected part 140 prevents the ultraviolet rays, illuminated onto the sealant 122 during the bonding process of the transparent substrate 102 and the packaging plate 124, from being reflected by the incline plane 126 of the packaging plate 124 onto the organic light-emitting layer 118 and onto the driving devices of the surrounding area of the EL display device.

Figure 6:
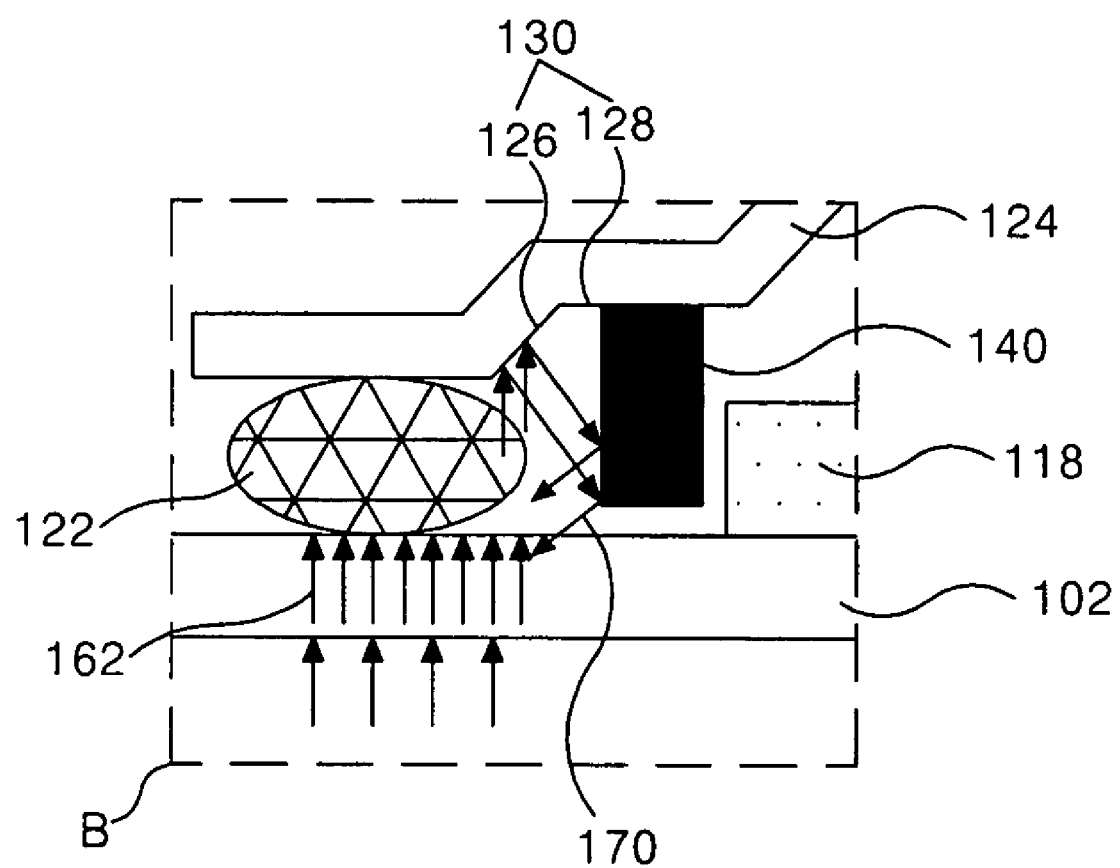
FIG. 6 is a sectional diagram of enlarged part B shown in FIG. 5.

More specifically, the electro luminescence display device according to the first embodiment of the present invention allows for the illumination of ultraviolet rays onto the sealant 122, spread at the edge of the packaging plate 124, to harden the sealant 122, and thereby bond the transparent substrate 102 with the packaging plate 124. The light-intercepting projected part 140, as shown in FIG. 6, prevents light 170 from the ultraviolet rays, which is illuminated onto the sealant 122, from being reflected by the incline plane 126 of the packaging plate 124 onto the organic light-emitting layer 118 and the driving devices of the surrounding part of the EL display device. Accordingly, the electro luminescence display device according to the first embodiment of the present invention can prevent the deterioration of the organic light-emitting layer 118 and characteristic changes of the driving devices of the surrounding part of the EL display device caused by the reflected light 170.

Figure 7:
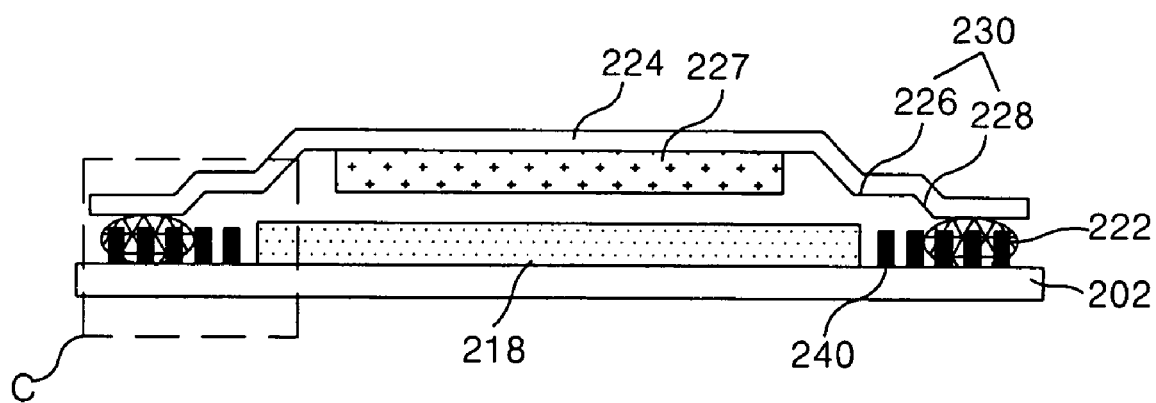
FIG. 7 is a sectional diagram representing an electro luminescence display device according to a second embodiment of the present invention.

Referring to FIG. 7, an electro luminescence display device according to a second embodiment of the present invention includes a transparent substrate 202; an organic light-emitting layer 218 formed on the transparent substrate 202; a packaging plate 224 to seal off the organic light-emitting layer 218 on the transparent substrate 202; a sealant 222 to bond the packaging plate 224 with the transparent substrate 202; and a plurality of light-intercepting projected parts 240 projected toward the packaging plate 224 from the transparent substrate 202 to prevent a reflected light caused by the dispersion of ultraviolet rays from being illuminated onto the light-emitting layer 218.

The organic light-emitting layer 218 includes an electron injection layer, an electron transport layer, a light-emitting layer, a hole transport layer and a hole injection layer that are deposited between an anode and a cathode (not shown). In the organic light-emitting layer 218, if voltage is applied between a transparent electrode as the anode and a metal electrode as the cathode, the electrons generated from the cathode move to the light-emitting layer through the electron injection layer and the electron transport layer, and the holes generated from the anode move to the light emitting layer through the hole injection layer and the hole transport layer. Accordingly, in the light-emitting layer, the electrons and the holes supplied from the electron transport layer and the hole transport layer collide with each other to be recombined, thereby generating light. The light is emitted to the outside through the anode, the transparent electrode, to display a picture.

The packaging plate 224 is bonded with the transparent substrate 202 by the sealant 222 to cover the organic light-emitting layer 218. The packaging plate 224 absorbs moisture and oxygen in the air, so a hygroscopic film 227 is stuck to the packaging plate 224 in order to protect the organic light-emitting layer 218 from the moisture and oxygen in the air. For this, the packaging plate 224 includes a stepped part 230 having an incline plane 226 and a horizontal plane 228. The stepped part 230 provides an inner space, where the hygroscopic film 227 is stuck, in the central part of the packaging plate 224.

The sealant 222 is spread between the transparent substrate 202 and the most outer stepped plane 228 of the packaging plate 224, and then it is hardened by illuminating it with ultraviolet rays thereby bonding the packaging plate 224 with the transparent substrate 202. Hereby, the packaging plate 224 seals up the organic light-emitting layer 218 by being bonded with the transparent substrate 202 by the sealant 222 in a vacuum state.

The light-intercepting projected parts 240 are projected toward a transparent substrate 202 to have a section of any one shape of a quadrangle and a triangle at the edge of the transparent substrate 202. In other words, the light-intercepting projected part 240 is formed between the organic light-emitting layer 218 and the end of the transparent substrate 202, and the sealant 222 is spread on part of the light-intercepting projected part 240.

The light-intercepting projected parts 240 prevent the ultraviolet rays, illuminated onto the sealant 222 during the bonding process of the transparent substrate 202 and the packaging plate 224, from being reflected by the incline plane 226 of the packaging plate 224 onto the organic light-emitting layer 218 and onto the driving devices of the surrounding area of the EL display device.

Figure 8:
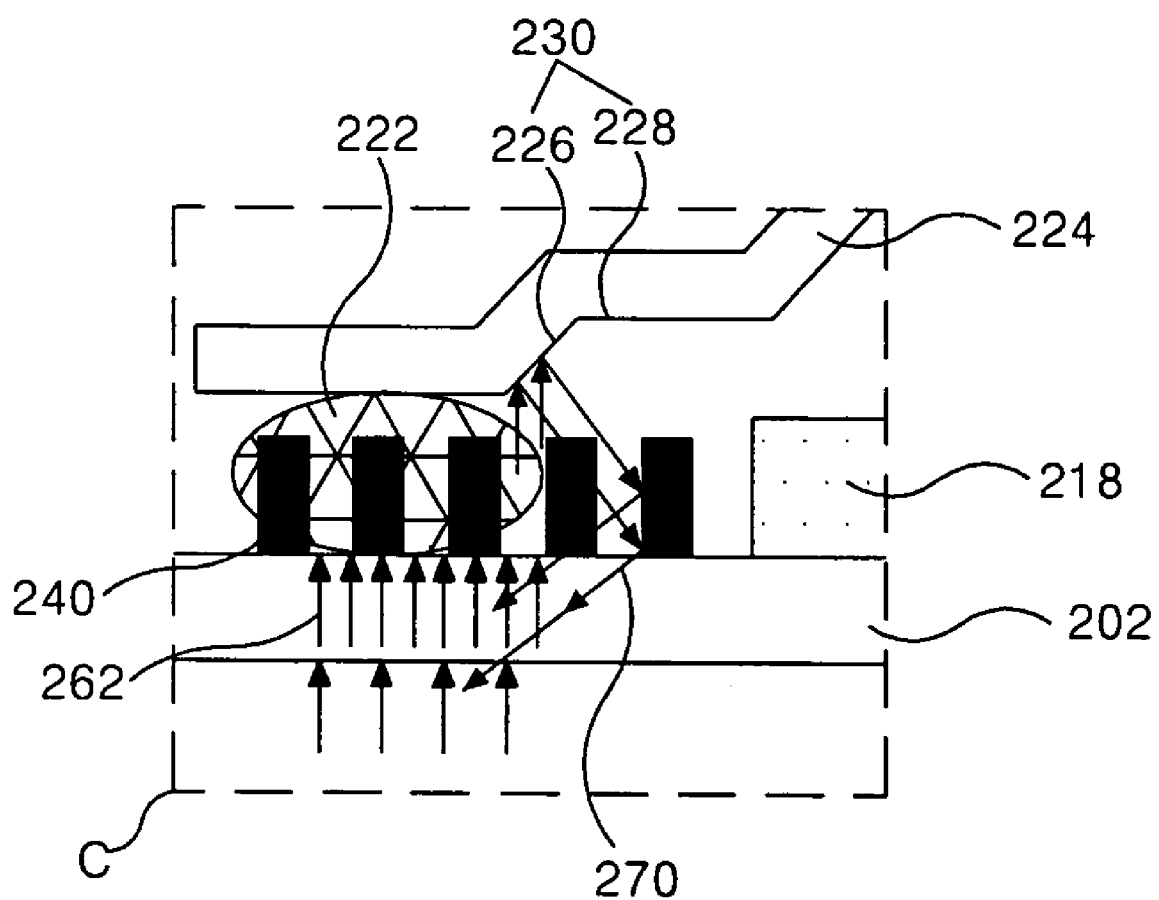
FIG. 8 is a sectional diagram of enlarged part C shown in FIG. 7.

More specifically, the electro luminescence display device according to the second embodiment of the present invention allows for the illumination of ultraviolet rays onto the sealant 222, spread at the edge of the packaging plate 224, to harden the sealant 222, and thereby bond the transparent substrate 202 with the packaging plate 224. The light-intercepting projected parts 240, as shown in FIG. 8, prevents light 270 from the ultraviolet rays, which is illuminated onto the sealant 222, from being reflected by the incline plane 226 of the packaging plate 224 onto the organic light-emitting layer 218 and the driving devices of the surrounding part of the EL display device. For this, the light-intercepting projected part 240 is projected from the transparent substrate 202 to be as close as possible to the packaging plate 224 to prevent the reflected light 270 from reaching the organic light-emitting layer 218.

Accordingly, the electro luminescence display device according to the second embodiment of the present invention can prevent the deterioration of the organic light-emitting layer 218 and characteristic changes of the driving devices of the surrounding part of the EL display device caused by the reflected light 270 that is generated by the packaging plate 224 during the hardening of the sealant 222.

Figure 9:
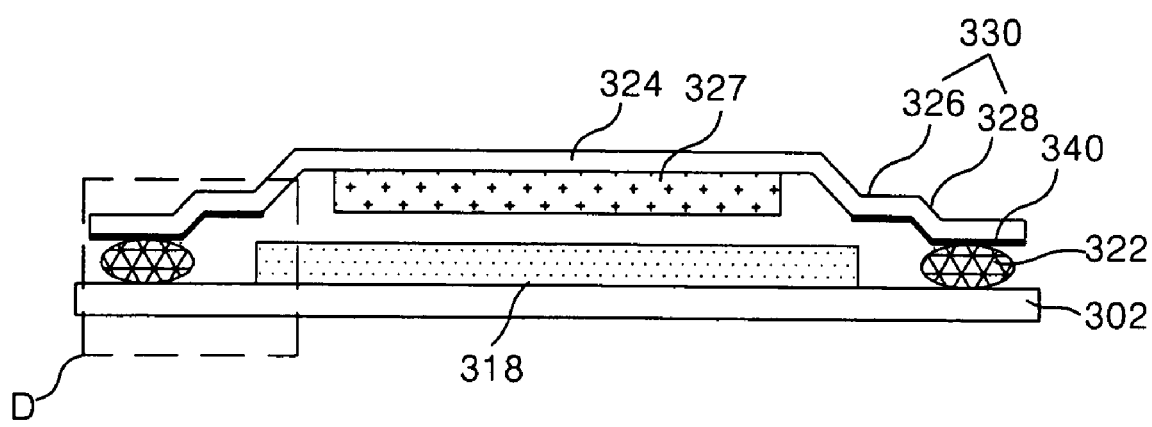
FIG. 9 is a sectional diagram representing an electro luminescence display device according to a third embodiment of the present invention.

Referring to FIG. 9, an electro luminescence display device according to a third embodiment of the present invention includes a transparent substrate 302; an organic light-emitting layer 318 formed on the transparent substrate 302; a packaging plate 324 to seal off the organic light-emitting layer 318 on the transparent substrate 302; a sealant 322 to bond the packaging plate 324 with the transparent substrate 302; and an ultraviolet ray absorbing layer 340 formed at the packaging plate 324 to prevent an ultraviolet ray illuminated onto the sealant 322 upon bonding the packaging plate 324 with the transparent substrate 302, from being illuminated onto the light-emitting layer 318.

The organic light-emitting layer 318 includes an electron injection layer, an electron transport layer, a light-emitting layer, a hole transport layer and a hole injection layer that are deposited between an anode and a cathode (not shown). In the organic light-emitting layer 318, if voltage is applied between a transparent electrode as the anode and a metal electrode as the cathode, the electrons generated from the cathode move to the light-emitting layer through the electron injection layer and the electron transport layer, and the holes generated from the anode move to the light emitting layer through the hole injection layer and the hole transport layer. Accordingly, in the light-emitting layer, the electrons and the holes supplied from the electron transport layer and the hole transport layer collide with each other to be recombined, thereby generating light. The light is emitted to the outside through the anode, the transparent electrode, to display a picture.

The packaging plate 324 is bonded with the transparent substrate 302 by the sealant 322 to cover the organic light-emitting layer 318. The packaging plate 324 absorbs moisture and oxygen in the air, so a hygroscopic film 327 is stuck to the packaging plate 324 in order to protect the organic light-emitting layer 318 from the moisture and oxygen in the air. For this, the packaging plate 324 includes a stepped part 330 having an incline plane 326 and a horizontal plane 328. The stepped part 330 provides an inner space, where the hygroscopic film 327 is stuck, in the central part of the packaging plate 324.

The sealant 322 is spread between the transparent substrate 302 and the most outer stepped plane 328 of the packaging plate 324, and then it is hardened by illuminating it with ultraviolet rays, thereby bonding the packaging plate 324 with the transparent substrate 302. Hereby, the packaging plate 324 seals up the organic light-emitting layer 318 by being bonded with the transparent substrate 302 by the sealant 322 in a vacuum state.

The ultraviolet absorbing layer 340 is formed at the horizontal plane 328 of the incline plane 326 along the edge of the packaging plate 324 that corresponds to the edge of the transparent substrate 302. In other words, the ultraviolet absorbing layer 340 is formed at the rear surface of the packaging plate 324 to face to an area between the end of the transparent substrate 302 and the end of the organic light-emitting layer 318. Also, the ultraviolet absorbing layer 340 is formed to overlap the edge area of the organic light-emitting layer 318.

The ultraviolet absorbing layer 340 prevents the ultraviolet rays, illuminated onto the sealant 322 during the bonding process of the transparent substrate 302 and the packaging plate 324, from being reflected by the incline plane 326 of the packaging plate 324 onto the organic light-emitting layer 318 and onto the driving devices of the surrounding area of the EL display device.

Figure 10:
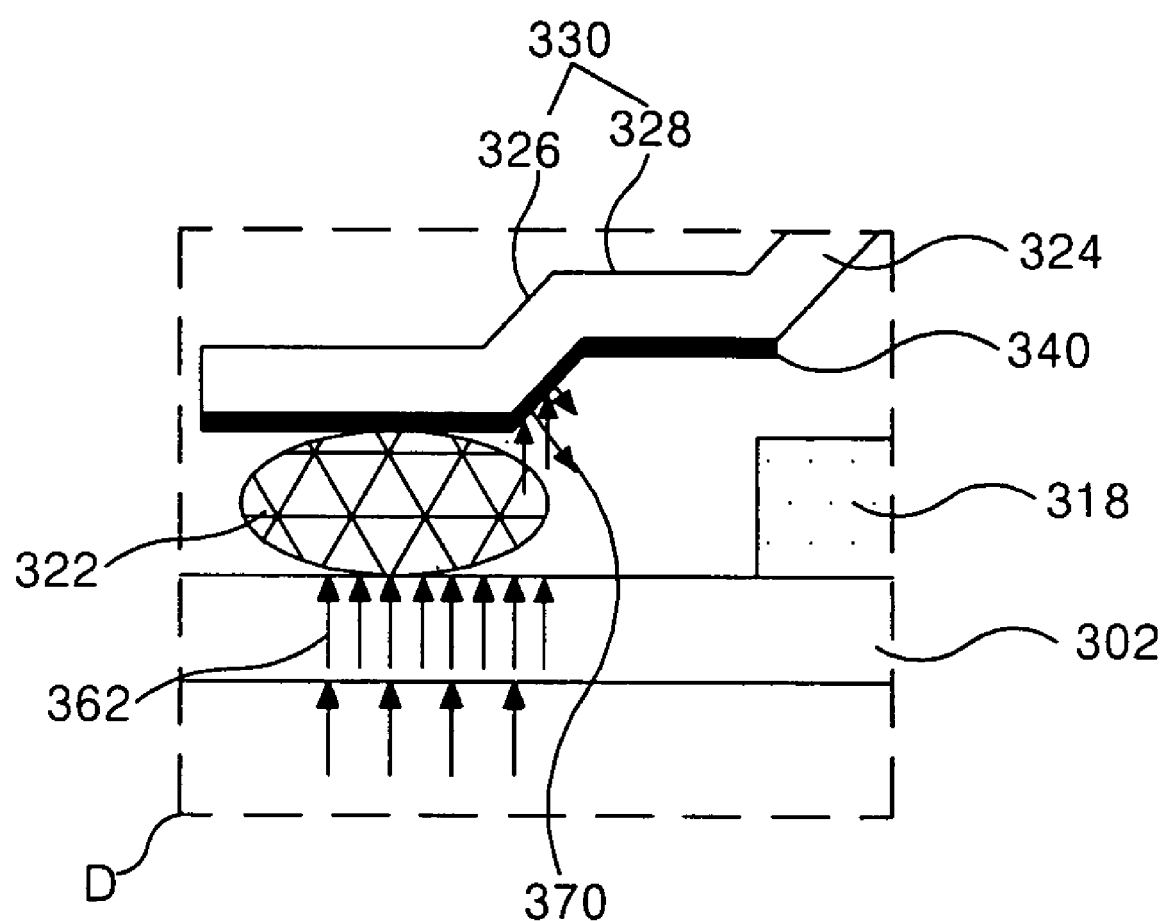
FIG. 10 is a sectional diagram of enlarged part D shown in FIG. 9.

More specifically, the electro luminescence display device according to the third embodiment of the present invention allows for the illumination of ultraviolet rays onto the sealant 322, spread at the edge of the packaging plate 324, to harden the sealant 322, and thereby bond the transparent substrate 302 with the packaging plate 324. The ultraviolet absorbing layer 340, as shown in FIG. 10, when the ultraviolet ray 362 is illuminated onto the sealant 322, absorbs the ultraviolet ray 362 that would be reflected toward the organic light-emitting layer 318 by the incline plane 326 and the horizontal plane 328 of the packaging plate 324. In other words, the ultraviolet absorbing layer 340 reduces the reflection efficiency of the stepped part 330 to prevent reflected light toward the organic light-emitting layer 318. Accordingly, the electro luminescence display device according to the third embodiment of the present invention can prevent the deterioration of the organic light-emitting layer 318 and characteristic changes of the driving devices of the surrounding part of the EL display device caused by the reflected light 370 that is generated by the packaging plate 324 upon the hardening of the sealant 322.

As described above, the electro luminescence display device according to the present invention includes the light-intercepting projected part which is projected toward the transparent substrate from the edge of the packaging plate. Accordingly, the present invention intercepts the ultraviolet ray which are illuminated onto the sealant upon bonding the transparent substrate with the packaging plate and reflected by the packaging plate toward the organic light-emitting layer, thereby preventing the deterioration of the organic light-emitting layer and characteristic changes of the driving devices of the surrounding part of the EL display device.

Further, the electro luminescence display device according to another embodiment of the present invention includes a plurality of light-intercepting projected parts which are projected toward the packaging plate from the edge of the transparent substrate. Accordingly, the present invention prevents the ultraviolet rays, which are illuminated onto the sealant during bonding the transparent substrate with the packaging plate, from being reflected onto the organic light-emitting layer, by use of the plurality of light-intercepting projected parts, thereby preventing the deterioration of the organic light-emitting layer and characteristic changes of the driving devices of the surrounding area of the EL display device.

Further, the electro luminescence display device according to another embodiment of the present invention includes the ultraviolet absorbing layer that is formed at the edge of the packaging plate. Accordingly, the present invention absorbs the ultraviolet ray, which is illuminated onto the sealant during bonding the transparent substrate with the packaging plate, and prevents reflection by the packaging plate onto the organic light-emitting layer, by use of the ultraviolet absorbing layer, thereby preventing the deterioration of the organic light-emitting layer and characteristic changes of the driving devices of the surrounding area of the EL display device.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. An electro luminescence display device, comprising:

a transparent substrate;

an organic light-emitting layer formed on the transparent substrate;

a packaging plate bonded with the transparent substrate by a sealant to cover the organic light-emitting layer; and a light-intercepting member to prevent ultraviolet rays, illuminated onto the sealant and packaging plate during a bonding of the transparent substrate with the packaging plate, from being reflected onto the organic light-emitting layer.

2. The electro luminescence display device according to claim 1, wherein the light-intercepting member is a light-intercepting projected part which is projected toward the transparent substrate from the packaging plate.

3. The electro luminescence display device according to claim 2, wherein the light-intercepting projected part is located between the sealant and the organic light-emitting layer.

4. The electro luminescence display device according to claim 2, wherein the light-intercepting projected part is projected from the packaging plate and resides immediately adjacent to the organic light-emitting layer.

5. The electro luminescence display device according to claim 2, wherein the light-intercepting projected part is formed to have a sectional shape of a quadrangle or a triangle.

6. The electro luminescence display device according to claim 1, wherein the light-intercepting member is a plurality of light-intercepting projected parts that are projected toward the packaging plate from the transparent substrate.

7. The electro luminescence display device according to claim 6, wherein the light-intercepting projected parts are formed between the organic light-emitting layer and the end of the transparent substrate.

8. The electro luminescence display device according to claim 6, wherein each of the light-intercepting projected parts is formed to have a sectional shape of a quadrangle or a triangle.

9. The electro luminescence display device according to claim 1, wherein the light-intercepting member is an ultraviolet absorbing layer that is formed on a portion of the packaging plate facing the transparent substrate and absorbs the ultraviolet rays.

10. The electro luminescence display device according to claim 9, wherein the ultraviolet absorbing layer is formed at the edge of the packaging plate so as to face an area between the end of the transparent substrate and the edge of the organic light-emitting layer, and overlaps the edge of the organic light-emitting layer.

* * * * *